(12) United States Patent
Murakami et al.

(10) Patent No.: US 7,030,658 B2
(45) Date of Patent: Apr. 18, 2006

(54) SYSTEMS AND METHODS FOR OPERATING LOGIC CIRCUITS

(75) Inventors: Hiroaki Murakami, Austin, TX (US); Osamu Takahashi, Round Rock, TX (US); Jieming Qi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 10/764,179

(22) Filed: Jan. 23, 2004

(65) Prior Publication Data
US 2005/0162186 A1 Jul. 28, 2005

(51) Int. Cl.
*H03K 19/20* (2006.01)

(52) U.S. Cl. .................. 326/112; 326/55; 327/407; 327/408

(58) Field of Classification Search ............... 326/52, 326/54, 55, 112, 113; 327/407, 408
See application file for complete search history.

(56) References Cited

U.S. PATENT DOCUMENTS 5,410,194 A * 4/1995 Freidin et al. ............... 326/46
6,529,040 B1 * 3/2003 Carberry et al. ............. 326/40
2004/0236814 A1 * 11/2004 White ........................ 708/505

* cited by examiner

*Primary Examiner*—Daniel Chang

(74) *Attorney, Agent, or Firm*—DLA Piper Rudnick Gray Cary US LLP

(57) ABSTRACT

Systems and methods for reducing the power consumption of some combinations of logic gates by reducing the number of unnecessary transitions that are made by logic gates that do not affect the output of the logic. In one embodiment, a modified exclusive-OR (XOR) gate is coupled to a modified multiplexer. The XOR gate has two inputs, $A_{in}$ and $B_{in}$, and an output, $XOR_{out}$, which is provided as an input to the multiplexer. Another input to the multiplexer is $C_{in}$. A select signal is input to the multiplexer to select either $C_{in}$ or $XOR_{out}$ to be provided at the output of the multiplexer. If $XOR_{out}$ is selected, the XOR gate operates in a first mode in which it functions as a normal XOR gate. If $C_{in}$ is selected, the XOR gate operates in a second mode in which the XOR gate uses less power than when the XOR gate operates normally.

18 Claims, 15 Drawing Sheets

| Ain | Bin | XORout |
|---|---|---|
| 0 | 0 | 0 |
| 0 | 1 | 1 |
| 1 | 0 | 1 |
| 1 | 1 | 0 |

Fig. 2

| XORout | Cin | Sel | MUXout |
|--------|-----|-----|--------|
| *1     | *2  | 0   | *2     |
| *1     | *2  | 1   | *1     |

*1 and *2 can be either 0 or 1.

Fig. 3

| Ain | Bin | XORout | Cin | Sel | MUXout |
|---|---|---|---|---|---|
| 0 | 0 | 0 | * | 1 | 0 |
| 0 | 1 | 1 | * | 1 | 1 |
| 1 | 0 | 1 | * | 1 | 1 |
| 1 | 1 | 0 | * | 1 | 0 |
| * | * | * | 0 | 0 | 0 |
| * | * | * | 1 | 0 | 1 |

Fig. 4

| Ain | Bin | C | sel | A_b | B_b | B | xnor_out | sel_b | C_b | mux_out |
|---|---|---|---|---|---|---|---|---|---|---|
| 0 | 0 | * | 1 | 1 | 1 | 0 | 1 | 0 | 1 | 0 |
| 0 | 1 | * | 1 | 1 | 0 | 1 | 0 | 0 | 1 | 1 |
| 1 | 0 | * | 1 | 0 | 1 | 0 | 0 | 0 | 1 | 1 |
| 1 | 1 | * | 1 | 0 | 0 | 1 | 1 | 0 | 1 | 0 |
| 0 | 0 | 1 | 0 | 1 | 1 | 0 | 1 | 1 | 0 | 1 |
| 0 | 1 | 1 | 0 | 1 | 1 | 0 | 1 | 1 | 0 | 1 |
| 1 | 0 | 0 | 0 | 1 | 1 | 0 | 1 | 1 | 1 | 0 |
| 1 | 1 | 0 | 0 | 1 | 1 | 0 | 1 | 1 | 1 | 0 |

Fig. 7

SYSTEMS AND METHODS FOR OPERATING LOGIC CIRCUITS

BACKGROUND OF THE INVENTION

Digital logic circuits are widely used in electronic systems. These systems may be very simple systems, such as individual logic gates that are used for simple control circuits. They may also include moderately complex systems, such as integrated logic circuits that are used for controllers are embedded processors. These systems may also include processors that are much more complex and are used in powerful computing systems.

These digital electronic systems are typically designed primarily in terms of the logic functions that are performed by their various subsystems and components. In other words, the design of the system focuses on the logic that will be used by the system to handle input, output, control and other information. The logic design is based upon the use of logic gates, such as AND, OR, NAND, NOR, XOR and various other types of gates. While these gates are, from the perspective of the logic design, the basic building blocks of the hardware logic of the system, it is important to keep in mind that each of these gates typically comprises transistors and various other electronic components that are combined to form the logic gate.

The electronic components that form the gates of the digital logic require power to operate. In other words, the logic gates are not simply passive devices that require no power to produce a desired output from a given input. Because of the increasing number of logic gates and corresponding electronic components in systems such as data processors, the amount of power that is required by the electronic components is increasingly a concern in the design of these systems. Accordingly, it is, as a general matter, always desirable to provide new ways to reduce the amount of power that is required by the system. Even a small power savings at the electronic component (sub-gate) level may translate to a large power savings at the system level because of the large number of electronic components within the system.

SUMMARY OF THE INVENTION

One or more of the problems outlined above may be solved by the various embodiments of the invention. Broadly speaking, the invention comprises systems and methods for reducing the power consumption of some combinations of logic gates by reducing the number of unnecessary transitions that are made by logic gates that do not affect the output of the logic.

One embodiment of the invention comprises a system including a first logic circuit configured to receive one or more logic circuit input signals and to generate a logic circuit output signal; and a multiplexer configured to receive the logic circuit output signal and one or more additional signals as multiplexer input signals. The multiplexer is configured to also receive a select signal that controls the multiplexer to select one of the multiplexer input signals to be provided as a multiplexer output signal. When the select signal controls the multiplexer to select the logic circuit output signal as the multiplexer output signal, the first circuit operates in a first mode, and when the select signal controls the multiplexer to deselect the logic circuit output signal as the multiplexer output signal, the first circuit operates in a second mode. In one embodiment, the first logic circuit is a modified XOR gate and the second mode is a power saving mode in which the data transitions in the output of the XOR gate are eliminated to reduce the power used by the XOR gate.

An alternative embodiment of the invention comprises a method including the steps of providing a first logic circuit configured to receive one or more logic circuit input signals and to generate a logic circuit output signal, providing a multiplexer configured to receive the logic circuit output signal and one or more additional signals as multiplexer input signals and to receive a select signal that controls the multiplexer to select one of the multiplexer input signals to be provided as a multiplexer output signal. The method further includes operating the first logic circuit in a first mode when the first logic circuit is selected by the multiplexer and operating the first logic circuit in a second mode when the first logic circuit is deselected by the multiplexer. In one embodiment, the first logic circuit is a modified XOR gate and the second mode is a power saving mode in which the data transitions in the output of the XOR gate are eliminated to reduce the power used by the XOR gate.

Numerous additional embodiments are also possible.

BRIEF DESCRIPTION OF THE DRAWINGS

Other objects and advantages of the invention may become apparent upon reading the following detailed description and upon reference to the accompanying drawings.

FIG. 2 is a truth table showing the output ($XOR_{out}$) of an XOR gate corresponding to each possible pair of inputs ($A_{in}$, $B_{in}$)

FIG. 3 is a truth table showing the output ($MUX_{out}$) of a multiplexer corresponding to each possible set of inputs ($XOR_{out}$, $C_{in}$, Sel).

FIG. 4 is a truth table showing the output ($MUX_{out}$) and an intermediate signal ($XOR_{out}$) of a combination of an XOR gate and a multiplexer corresponding to each set of inputs ($A_{in}$, $B_{in}$, $C_{in}$, Sel)

FIG. 7 is a truth table showing the output ($MUX_{out}$) and an intermediate signal (XNORout) of a combination of a modified XOR gate and a modified multiplexer corresponding to each set of inputs ($A_{in}$, $B_{in}$, $C_{in}$, Sel).

Figure 1:
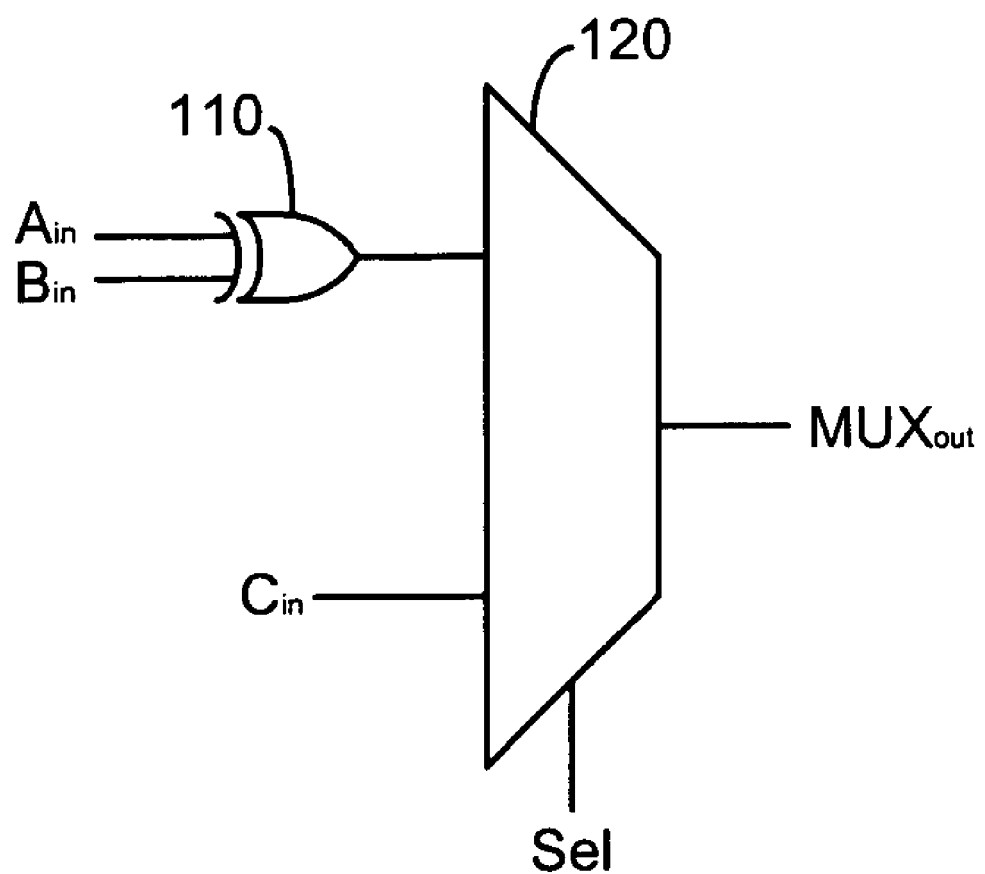
FIG. 1 is a diagram illustrating the interconnection of an XOR gate and a multiplexer.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for reducing the power consumption of some combinations of logic gates by reducing the number of unnecessary transitions that are made by logic gates that do not affect the output of the logic. In one embodiment, the combination of logic gates comprises a modified exclusive-OR (XOR) gate coupled to a modified multiplexer. In this embodiment, the XOR gate has two inputs: $A_{in}$; and $B_{in}$. The output of the XOR gate is provided as an input to the multiplexer. Another input to the multiplexer is $C_{in}$. A select signal is input to the multiplexer to control whether the multiplexer selects $C_{in}$ or the output of the XOR gate to provide at the output of the multiplexer. If the output of the XOR gate is selected, the XOR gate operates in a first mode in which it functions as a normal XOR gate. If $C_{in}$ is selected, the XOR gate operates in a second mode in which the XOR gate uses less power than when the XOR gate operates normally.

When the output of the XOR gate is not selected by the multiplexer, it doesn't matter what information is output by the XOR gate. The XOR gate can therefore provide incorrect output information (i.e., information that does not follow the truth table for an XOR gate). Consequently, the XOR gate can be configured to perform in a manner that reduces the amount of power drawn by the gate (i.e., a power saving mode) or that provides some other advantage over normal operation. In one embodiment, the XOR gate is configured to eliminate data transitions that would normally occur in the output of the XOR gate. These data transitions cause corresponding spikes in the power drawn by the XOR gate. By eliminating the data transitions when the XOR gate is deselected, less power is used by the XOR gate.

Referring to FIG. 1, a diagram illustrating the interconnection of an XOR gate and a multiplexer is shown. XOR gate 110 has two inputs. A first logic signal, $A_{in}$, is coupled to one of the inputs, while a second logic signal, $B_{in}$, is coupled to the other of the inputs. The XOR gate 110 is coupled to multiplexer 120 so that the output of XOR gate 110 is provided as an input to multiplexer 120. A third logic signal, $C_{in}$, is coupled to a second input to multiplexer 120. Multiplexer 120 also has a control input coupled to receive a select signal, Sel.

$A_{in}$, $B_{in}$, $C_{in}$ and Sel are all binary signals. That is, each of these signals takes one of two values: 0 or 1. $A_{in}$ and $B_{in}$ are processed by XOR gate 110 to generate a binary output signal, $XOR_{out}$. Multiplexer 120 selects this signal ($XOR_{out}$) or $C_{in}$, depending upon the state of select signal Sel, and provides the selected signal at the output of the multiplexer as signal $MUX_{out}$.

Figure 2:
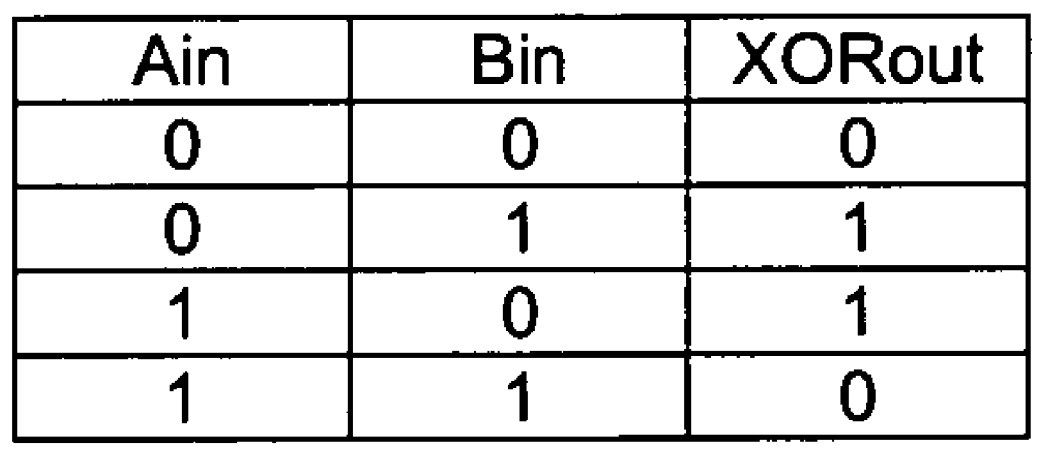

The signal output by XOR gate 110 ($XOR_{out}$) based upon input signals $A_{in}$ and $B_{in}$ is defined by the truth table shown in FIG. 2.

The signal output by multiplexer 120 ($MUX_{out}$) based upon input signals $XOR_{out}$, $C_{in}$ and Sel is defined by the truth table shown in FIG. 3.

As can be seen in FIG. 3, the output of multiplexer 120 ($MUX_{out}$) is dependent only upon the selected input signal. The deselected signal (i.e., the signal that is not selected) has no effect on the output ($MUX_{out}$). Thus, when $C_{in}$ is selected and $XOR_{out}$ is deselected, $C_{in}$, is passed through multiplexer 120 and provided at the output of the multiplexer as $MUX_{out}$. On the other hand, when $XOR_{out}$ is selected and $C_{in}$ is deselected, $XOR_{out}$ is passed through multiplexer 120 and provided at the output of the multiplexer as $MUX_{out}$.

When XOR gate 110 and multiplexer 120 are combined as shown in FIG. 1, they may be viewed as a single combinational logic circuit having inputs $A_{in}$, $B_{in}$, $C_{in}$ and Sel, and output $MUX_{out}$. The truth table for this combinational logic circuit is shown in FIG. 4. This table includes the values of intermediate signal $XOR_{out}$.

As noted above, logic gates such as XOR gate 110 and multiplexer 120 are themselves based upon electronic components such as transistors, inverters, and so on. For example, one prior art implementation of an XOR-multiplexer combinational logic circuit as shown in FIG. 1 is illustrated in FIG. 5.

Figure 5:
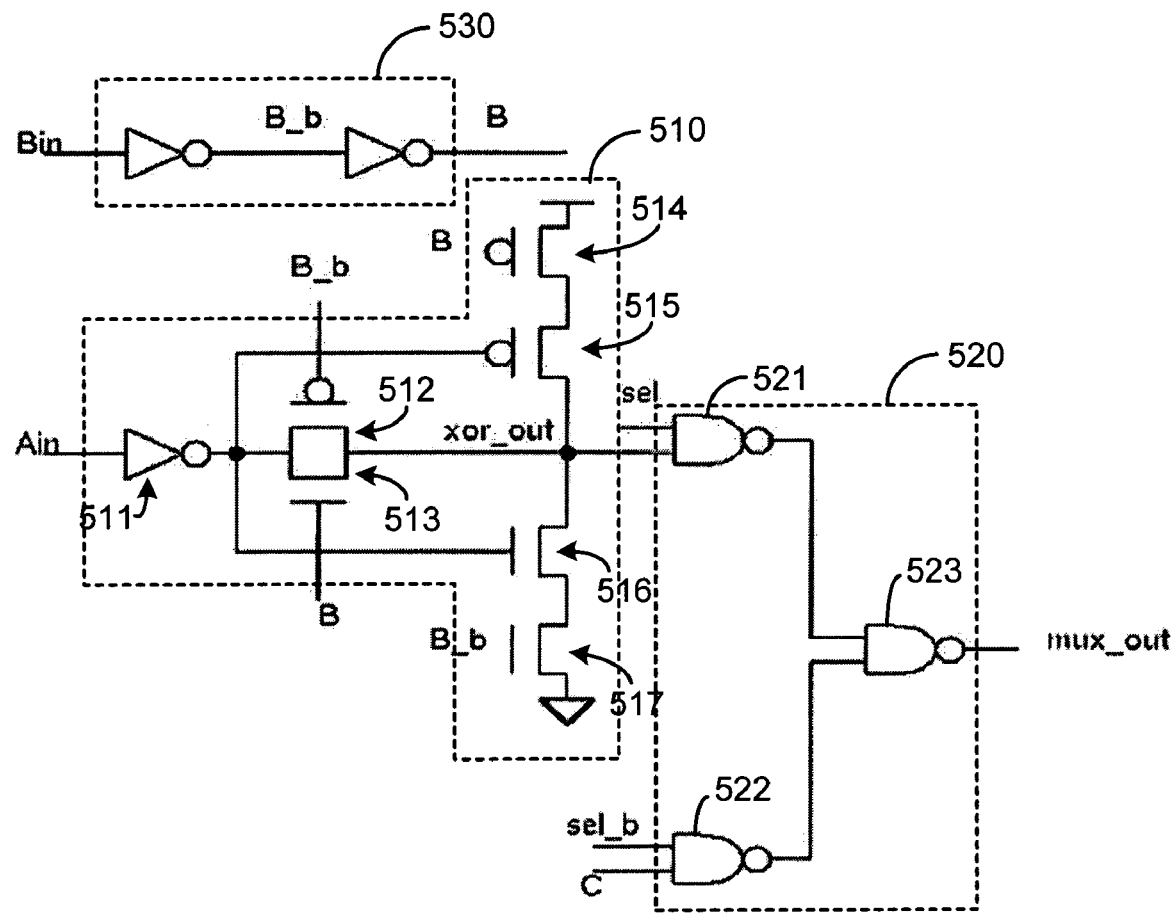
FIG. 5 is a diagram illustrating the electrical components of one design for a XOR-multiplexer combinational logic circuit in accordance with the prior art.

Referring to FIG. 5, a diagram illustrating the electrical components of a XOR-multiplexer combinational logic circuit in accordance with the prior art is shown. The circuit includes a group of components forming XOR gate 510 and a group of components forming multiplexer 520. It should be noted that XOR gate 510 makes use of not only signal $A_{in}$, but also signals B and B_b. In this embodiment, signal B is equal to signal $B_{in}$, while signal B_b is the inverse of $B_{in}$. The signals B_b and B are generated by inverting $B_{in}$ once and twice, respectively, using circuitry 530. Circuitry 530 is illustrated separately here in order to simplify the illustration of XOR gate 510 (by minimizing the crossing of electrical interconnections between the components).

XOR gate 510 consists of an inverter 511 and six transistors, 512–517. Three of the transistors (512, 514 and 515) are PMOS transistors, while the other three (513, 516 and 517) are NMOS transistors. $A_{in}$ is input to inverter 511, and the inverted signal is coupled through transistors 512 and 513 to the output of XOR gate 510. If one of transistors 512 or 513 is turned on, the output of inverter 511 is effectively directly coupled to the output of XOR gate 510. If both of transistors 512 and 513 are turned off, the output of inverter 511 is effectively isolated from the output of XOR gate 510. Transistors 512 and 513 are turned on and/or off by signals B and B_b, respectively.

It should be noted that transistors 512 and 513 are placed back-to-back in the diagram of FIG. 5 for the purpose of simplifying the diagram. Transistors 512 and 513 therefore appear as a square with a bar on the side of NMOS transistor 513 and a bar with a circle on the side of PMOS transistor 512. This same method of illustrating back-to-back transistors is used in the other figures as well.

If the output of inverter 511 is isolated from the output of XOR gate 510, the output of XOR gate 510 is controlled by whether transistors 514–517 are turned on or off, thereby coupling the output of the XOR gate to either Vcc (binary 1) or ground (binary 0). Transistors 514–517 are turned on/off by signals B, $A_{in}$, $A_{in}$ and B_b, respectively. It should be noted that the PMOS transistors are turned on when the respective signals are 0, and off when the respective signals are 1. Conversely, the NMOS transistors are turned on when the respective signals are 1, and off when the respective signals are 0.

XOR gate 510 implements the truth table of FIG. 2. XOR gate 510 operates as follows. When $A_{in}$ and $B_{in}$ are both 0 (and B is 0 and B_b is 1), both transistor 512 and transistor 513 are turned off, isolating the output of inverter 511 from the output of XOR gate 510. Because $A_{in}$ is 0, a 1 is applied to transistors 515 and 516, so transistor 515 is turned off and transistor 516 is turned on. A 0 is applied to transistor 514, turning it on, and a 1 is applied to transistor 517, turning it on as well. The output of XOR gate 510 is therefore coupled to ground through transistors 516 and 517, both of which are turned on. The output of XOR gate 510 is isolated from Vcc by transistor 515, which is turned off. Thus, for $A_{in}$ and $B_{in}$ equal to 0, the output of XOR gate 510 is 0.

When $A_{in}$ equals 0 and $B_{in}$ equals 1, a 0 is applied to transistor 512, while a 1 is applied to transistor 513, turning both of these transistors on. This effectively couples the output of inverter 511 to the output of XOR gate 510. 1's are applied to transistors 514 and 515, turning both of these transistors off. A 1 is also applied to transistor 516, thereby turning it on. A 0 is applied to transistor 517, turning this transistor off. Because both of transistors 514 and 515 are turned off, the output of XOR gate 510 is isolated from Vcc. Because transistor 517 is turned off, the output of XOR gate 510 is also isolated from ground, even know transistor 516 is turned on. Thus, for $A_{in}$ equal to 0 and $B_{in}$ equal to 1, the output of XOR gate 510 is 1.

When $A_{in}$ equals 1 and $B_{in}$ equals 0, a 1 is applied to transistor 512 and a 0 is applied to transistor 513, turning both of these transistors off. The output of inverter 511 is therefore isolated from the output of XOR gate 510. 0's are applied to transistors 514 and 515, turning them on. The output of XOR gate 510 is therefore coupled to Vcc. A 0 is applied to transistor 516, turning it off. A 1 is applied to transistor 517, turning it on. Because transistor 516 is off, the output of XOR gate 510 is isolated from ground, even transistor 517 is on. Thus, for $A_{in}$ equal to 1 and $B_{in}$ equal to 0, the output of XOR gate 510 is 1

When $A_{in}$ equals 1 and $B_{in}$ equals 1, a 0 is applied to transistor 512, while a 1 is applied to transistor 513, turning both of these transistors on. This effectively couples the output of inverter 511 to the output of XOR gate 510. A 1 is applied to transistor 514, turning it off. A 0 is applied to transistor 515, turning it on. A 0 is applied to transistor 516, thereby turning it off. A 0 is applied to transistor 517, turning this transistor off. Because both of transistors 516 and 517 are turned off, the output of XOR gate 510 is isolated from ground. Because transistor 514 is turned off, the output of XOR gate 510 is also isolated from Vcc, even though transistor 515 is turned on. Thus, for $A_{in}$ equal to 1 and $B_{in}$ equal to 1, the output of XOR gate 510 is 0.

Multiplexer 520 implements the truth table of FIG. 3. Multiplexer 520 operates as follows, where Sel_b is the inverse of select signal Sel. When select signal Sel is 0 (and Sel_b is 1), one of the two inputs to NAND gate 521 is a 0, so the output of NAND gate 521 will be 1, regardless of the other input. Thus, whether the output of XOR gate 510 is a 0 or a 1, the output of NAND gate 521 will be 1. Since one of the inputs to NAND gate 522 is 1, the output of NAND gate 522 will depend upon the other input to the gate ($C_{in}$). If $C_{in}$ is 1, the output of NAND gate 522 will be 0. If $C_{in}$ is 0, the output of NAND gate 522 will be 1. In other words, NAND gate 522 inverts the value of $C_{in}$. Since, when Sel is equal to 0, the output of NAND gate 521 is always 1, the corresponding input to NAND gate 523 will always be 1 if Sel is 0. The output of NAND gate 523 (hence multiplexer 520) therefore depends upon the output of NAND gate 522. When the output of NAND gate 522 is 1, the output of NAND gate 523 is 0. When the output of NAND gate 522 is 0, the output of NAND gate 523 is 1. NAND gate 523 therefore inverts the output of NAND gate 522. Ultimately, when Sel is 0, the output of multiplexer 520 ($MUX_{out}$) is equal to $C_{in}$.

As noted above, the entire circuit illustrated in FIG. 5, including XOR gate 510 and multiplexer 520 implements the truth table shown in FIG. 4. It can be seen from the first three columns of the table in this figure that XOR gate 510 operates in the normal manner, generating an output signal ($XOR_{out}$) that is 1 if only one of the inputs is a 1, and 0 otherwise. Multiplexer 520 also operates in the normal manner, producing a $MUX_{out}$ signal that is equal to $XOR_{out}$ if the select signal, Sel, is 1 and is equal to $C_{in}$ if Sel is 0.

Thus, in the combined operation of XOR gate 510 and multiplexer 520, when Sel is 1 (so that $XOR_{out}$ is selected and $C_{in}$ is deselected), the output signal ($MUX_{out}$) is dependent only upon $XOR_{out}$. It does not matter what the value of $C_{in}$ is in this instance. Consequently, the value of $C_{in}$ in the truth table is shown as "*" where Sel is 1. Conversely, when Sel is 0, $C_{in}$ is selected and $XOR_{out}$ is deselected. Therefore, output signal $MUX_{out}$ is dependent only upon $C_{in}$ and the value of $XOR_{out}$ is irrelevant.

This is of interest because, when $C_{in}$ is selected and $XOR_{out}$ is deselected, XOR gate 510 continues to operate normally, generating a signal ($XOR_{out}$) corresponding to the received input signals ($A_{in}$ and $B_{in}$) and drawing power in the process. In particular, the structure of XOR gate 510 is such that there are spikes in the power drawn by the gate when there are transitions in $XOR_{out}$. In other words, when $XOR_{out}$ transitions from 0 to 1, or from 1 to 0, there is a power spike. Since the value of $XOR_{out}$ is irrelevant to the output of the combined circuit, however, these transitions are unnecessary. By reducing or eliminating the transitions in $XOR_{out}$ when $XOR_{out}$ is deselected, the amount of power used by XOR gate 510 can be reduced, making the circuit more efficient.

The various embodiments of the invention take advantage of the fact that it is not necessary to maintain normal operation of the deselected gate or to expend to the power that would be necessary for normal operation. Thus, the operation of the gate is modified to reduce the number of signal transitions when the output of the gate is deselected. It should be noted that, while the specific embodiments described herein focus on the combination of an XOR gate with a multiplexer, alternative embodiments may incorporate gates other than XOR gates. For example, the circuit may be a combination of a multiplexer with an AND gate, an OR gate, or some other type of gate. In some embodiments, multiple gates may be employed in place of the single XOR gate described in the examples herein.

Figure 6:
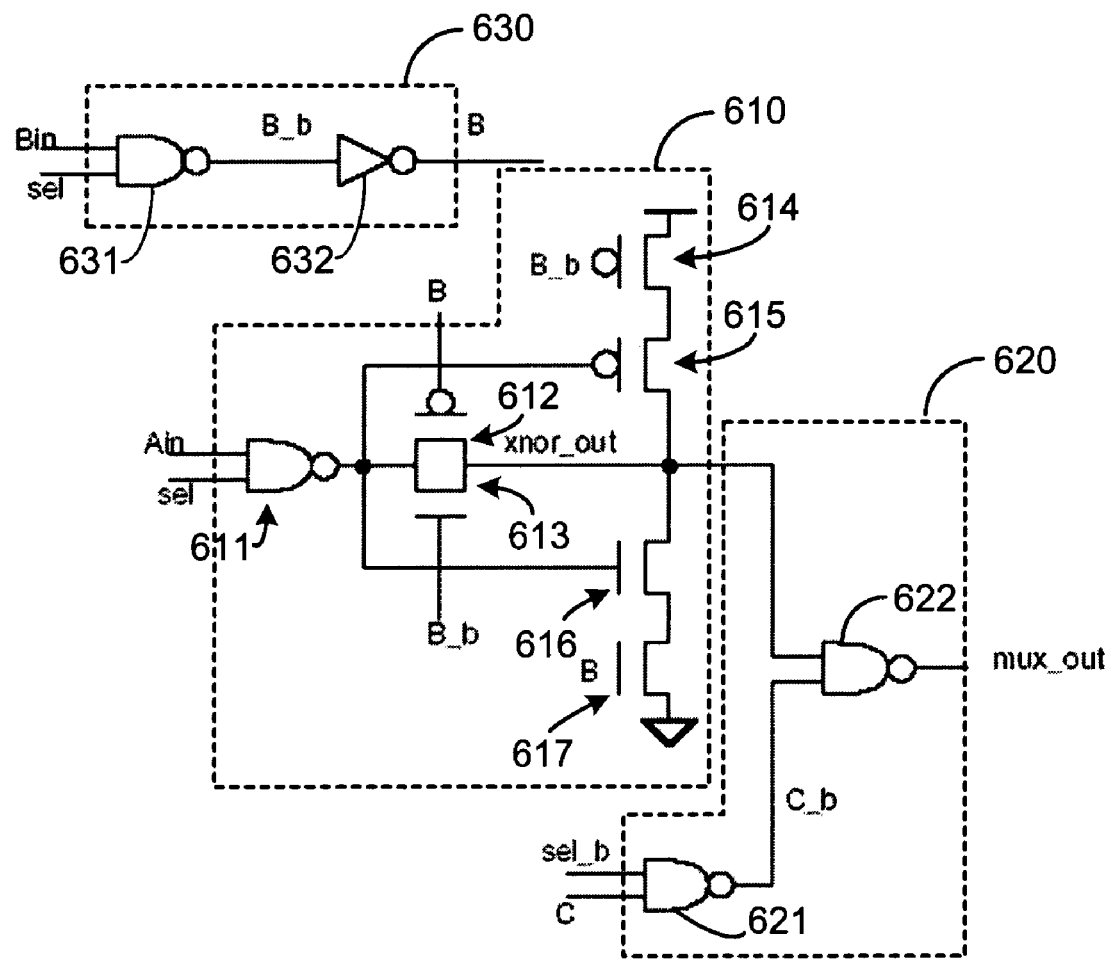
FIG. 6 is a diagram illustrating the electrical components of a modified XOR-multiplexer combinational logic circuit in accordance with one embodiment of the invention.

Referring now to FIG. 6, a diagram illustrating the electrical components of a modified XOR-multiplexer combinational logic circuit in accordance with one embodiment is shown. This circuit includes a group of components forming a modified XOR gate 610, a group of components forming a modified multiplexer 620, and a group of components 630 used to generate signals B and B_b from input signal $B_{in}$. The circuit illustrated in FIG. 6 has inputs and outputs that are identical to the circuit of FIG. 5 and operates according to a truth table for which the values of these inputs and outputs are identical to the values shown in FIG. 4. The truth table for the circuit of FIG. 6 is a shown in FIG. 7. The only difference between the truth tables of FIG. 4 and FIG. 7 is the values of the intermediate signal, $XOR_{out}$, when Sel has a value of 1.

In the circuit of FIG. 6, input signal $B_{in}$, rather than simply being inverted to generate B_b and then inverted again to generate B is processed by circuit 630. In circuit 630, $B_{in}$ and Sel are input to a NAND gate 631, the output of which is used as B_b. B_b is then inverted by inverter 632 to generate B. B_b and B are then used in the circuit formed by modified XOR gate 610 and modified multiplexer 620.

Modified XOR gate 610 is, in this embodiment, actually an XNOR gate. In gate 610 may therefore be alternately referred to as an XNOR gate, or a modified XOR gate. XNOR gate 610 consists of a NAND gate 611 and six transistors 612–617. Three of the transistors, 612, 614 and 615 are PMOS transistors, while the other three transistors, 613, 616 and 617, are NMOS transistors. Input signals $A_{in}$ and Sel are provided to NAND gate 611. The output of NAND gate 611 is coupled to the output of modified XOR gate 610 through transistors 612 and 613. If one of transistors 612 or 613 is turned on, the output of NAND gate 611 is effectively directly coupled to the output of modified XOR gate 610. If both of transistors 612 and 613 are turned off, the output of NAND gate 611 is isolated from the output of modified XOR gate 610. Transistors 612 and 613 are turned on by signals B and B_b, respectively.

If the output of NAND gate 611 is isolated from the output of modified XOR gate 610, the output of modified XOR gate 610 is controlled by transistors 614–617. Depending upon whether these transistors are turned on or off, and which of the transistors are turned on or off, the output of modified XOR gate 610 may be coupled either to Vcc, or to ground. If both of transistors 614 and 615 are turned on, the output of modified XOR gate 610 will be coupled to Vcc, and the output of the gate will be 1. If both of transistors 616 and 617 are turned on, the output of modified XOR gate 610 will be coupled to ground and the output of the gate will be 0.

The output of modified XOR gate 610 is input to multiplexer 620. Rather than being input to a NAND gate as in FIG. 5, the output of modified XOR gate 610 is directly input to NAND gate 622. The other input to NAND gate 622 is provided by NAND gate 621. The inputs to NAND gate 621 include the signals $C_{in}$ and Sel_b. The output of NAND gate 622 is the output of multiplexer 620 ($MUX_{out}$).

As noted above, the circuit of FIG. 6 implements the truth table of FIG. 7. This circuit operates as follows. In order to select the XOR gate as the output of the multiplexer, the select signal, Sel, is set to 1 (and Sel_b is 0). Referring to multiplexer 620, the inputs to NAND gate 621 are Sel_b (0) and $C_{in}$. Regardless of the value of $C_{in}$, the output of NAND gate 621 will be 1 (because input Sel_b is 0). Consequently, the corresponding input to NAND gate 622 will be 1, and the output of NAND gate 622 will depend upon the output of modified XOR gate 610. More specifically, the output of NAND gate 622 will be the inverse of the output of modified XOR gate 610. Therefore, in order to operate as a combination of an XOR gate and a multiplexer, modified XOR gate 610 must provide at its output the inverse of a normal XOR gate output (i.e., the output of an XNOR gate) when Sel is 1.

First, it should be noted that, referring to circuit 630, if Sel is 1, B is equal to $B_{in}$, and B_b is equal to the inverse of $B_{in}$. Thus, if $B_{in}$ is 1, B is 1 and B_b is 0. Conversely, if $B_{in}$ is 0, B is 0 and B_b is 1. Referring then to modified XOR gate 610, if Sel is 1, the output of NAND gate 611 is the inverse of $A_{in}$. Assuming both $A_{in}$ and $B_{in}$ are 0, a 0 is applied to transistor 612 and a 1 is applied to transistor 613, turning both of these transistors on. The output of NAND gate 611 (a 1) is therefore coupled to the output of modified XOR gate 610. It should be noted that 1s are applied to transistors 614 and 615, turning both of them off and isolating the output of modified XOR gate 610 from Vcc. A 1 is applied to transistor 616, turning it on and a 0 is applied to transistor 617, turning it off. The output of modified XOR gate 610 is therefore also isolated from ground. Therefore, for $A_{in}$ and $B_{in}$ equal to 0, the output of modified XOR gate 610 is 1.

Assuming that both $A_{in}$ and $B_{in}$ are 1 (and Sel is 1), the output of NAND gate 611 is 0. A 1 is applied to transistor 612, and a 0 is applied to transistors 613, turning both of these transistors off. The output of modified XOR gate 610 is therefore isolated from the output of NAND gate 611. 0s are applied to transistors 614 and 615, turning both of these transistors on. The output of modified XOR gate 610 is thereby coupled to Vcc (logic 1). A 0 is applied to transistor 616, turning it off, and a 1 is applied to transistor 617, turning it on. Because transistor 616 is turned off, the output of modified XOR gate 610 is isolated from ground. Thus, for $A_{in}$ and $B_{in}$ equal to 0, the output of modified XOR gate 610 is 1.

If $A_{in}$ is 0 and $B_{in}$ is 1 (and Sel is 1), the output of NAND gate 611 is 1. A 1 is applied to transistor 612 and a 0 is applied to transistor 613, turning both of these transistors off. The output of modified XOR gate 610 is thereby isolated from the output of NAND gate 611. A 0 is applied to transistor 614 and a 1 is applied to transistor 615, turning them both off. Because transistors 614 and 615 are turned off, the output of modified XOR gate 610 is isolated from Vcc. 1s are applied to both transistor 616 and transistor 617, turning both of these transistors on. Because both of transistors 616 and 617 are turned on, the output of modified XOR gate 610 is coupled to ground (logic 0). Consequently, for $A_{in}$ equal to 0 and $B_{in}$ equal to 1, the output of modified XOR gate 610 is 0.

If $A_{in}$ is 1 and $B_{in}$ is 0 (and Sel is 1), the output of NAND gate 611 is 0. A 0 is applied to transistor 612 and a 1 is applied to transistor 613, turning both of these transistors on. The output of modified XOR gate 610 is thereby coupled to the output of NAND gate 611. A 1 is applied to transistor 614, turning it off, and a 0 is applied to transistor 615, turning it on. Because transistor 614 is turned off, the output of modified XOR gate 610 is isolated from Vcc. 0s are applied to those transistor 616 and transistor 617, turning both of these transistors off and isolating the output of modified XOR gate 610 from ground. As result, for $A_{in}$ equal to 1 and $B_{in}$ equal to 0, the output of modified XOR gate 610 is 0.

It is therefore apparent that, when Sel is 1 and the output of modified XOR gate 610 is selected, the output of multiplexer 620 is that of an XOR gate. As mentioned above, when Sel is 0 and the output of modified XOR gate 610 is deselected, it does not matter whether modified XOR gate 610 provides the same outputs, as they will be disregarded by multiplexer 620. Modified XOR gate 610 is therefore designed to eliminate transitions between output values of 0 and 1 and to thereby eliminate the power drain associated with these transitions. More specifically, modified XOR gate 610 is designed to provide an output value of 1 whenever Sel is 0 in order to insure that the output of multiplexer 620 is equal to $C_{in}$. The operation of the circuit of FIG. 6 will be described below for the situation in which Sel is 0.

First, referring to multiplexer 620, if Sel is 0, $C_{in}$ should be selected and the output of modified XOR gate 610 should be deselected. When Sel is 0, Sel_b is 1, and the corresponding input to NAND gate 621 will be 1, as long as $C_{in}$ is selected. Since the Sel_b input to NAND gate 621 is one, the output of NAND gate 621 will be the inverse of the other input, $C_{in}$. As long as the output of modified XOR gate 610 is 1, NAND gate 622 will serve to invert the output of NAND gate 621, and $C_{in}$ will be provided at the output of multiplexer 620. It will therefore be shown below that, when Sel is 0 ($C_{in}$ is selected and the output of modified XOR gate 610 is deselected), the output of modified XOR gate 610 will always be 1.

Referring to circuit 630, when Sel is 0, the output of NAND gate 631 will always be 1. Consequently, B_b will be 1 and B will be 0, regardless of the value of $B_{in}$. Similarly, because the Sel input to NAND gate 611 in 0, the output of NAND gate 611 will be 1, regardless of the value of $A_{in}$. Consequently, for any values of $A_{in}$ and $B_{in}$, the operation of modified XOR gate 610 will be as follows.

A 0 is applied to transistor 612 and a 1 is applied to transistor 613, turning both of these transistors on. The output of NAND gate 611 (logic one) is therefore directly coupled to the output of modified XOR gate 610. 1s are applied to both of transistors 614 and 615, turning both of these transistors off and isolating the output of modified XOR gate 610 from Vcc. A 1 is applied to transistor 616, turning it on, and a 0 is applied to transistor 617, turning it off. Because transistor 617 is turned off, the output of modified XOR gate 610 is isolated from ground. Thus, it can be seen that, when $C_{in}$ is selected (Sel is 0 and Sel_b is 1), the output of modified XOR gate 610 is 1, regardless of the values of $A_{in}$ and $B_{in}$.

The embodiment of FIG. 6 provides a number of advantages over conventional designs. One of these advantages is the fact that, when the output of modified XOR gate 610 is deselected, the voltages applied to the gates of transistors 612–617 remain constant, and these voltages are such that the output of modified XOR gate 610 is isolated from both Vcc and ground. The design of modified XOR gate 610 therefore eliminates data transitions and the corresponding spikes in the amount of power that is used by the circuit. (It should be noted that alternative embodiments may reduce the number of data transitions rather than entirely eliminating them.) Another advantage provided by the design illustrated in FIG. 6 is that one of the gates that is normally used in the conventional design (NAND gate 221 in FIG. 5) is eliminated. This simplifies the design and eliminates power requirements and that were associated with the eliminated gate. Still other advantages may be apparent to those of skill in the art.

It should be noted that there are various circuit-level designs for XOR gates and multiplexers, and that other embodiments may vary from the specific design of the circuit illustrated in FIG. 6. Several examples of these alternative embodiments that operate as a combined XOR gate and multiplexer are described below. Further, as noted above, alternative embodiments of the invention are not limited to simple XOR-multiplexer combinations. For example, one alternative embodiment may comprise an XOR gate coupled to an n-input multiplexer rather than a simple 2-input multiplexer as shown above. Another alternative embodiment may comprise an n-input XOR gate coupled to a multiplexer. Still another alternative embodiment may comprise an entirely different type of gate, or combination of gates coupled to a multiplexer. In each of these embodiments, the logic gate(s) are designed to operate in one mode (corresponding to normal operation) when selected by the multiplexer and to operate in a different mode when deselected. In the embodiments described above, the second mode may, in part, be characterized as a power saving noted in which the number of data transitions is reduced or eliminated in order to avoid power drains corresponding to the data transitions.

Figure 8:
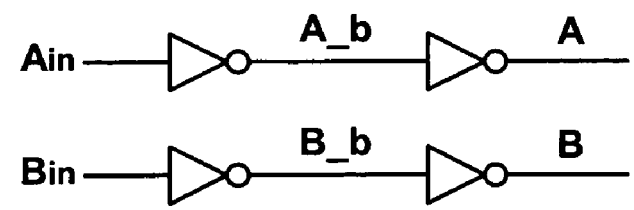
FIG. 8 is a diagram illustrating the electrical components of an alternative design for a XOR-multiplexer combinational logic circuit in accordance with the prior art.
Figure 8:
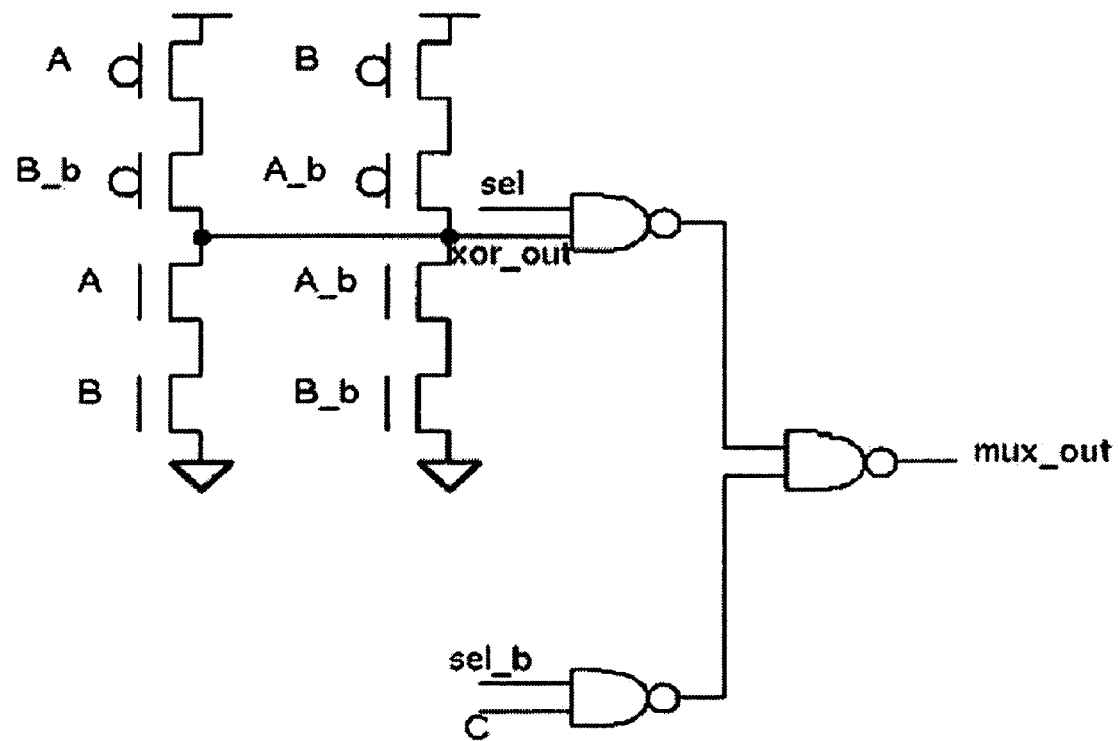

As mentioned above, the circuit-level design of a logic gate (e.g., an XOR gate) may vary in different embodiments, while still performing an identical function. Different circuit-level designs may provide different advantages. This is true for conventional designs, as well as different embodiments of the invention. For example, referring to FIG. 8, an alternative conventional design for a combination of an XOR gate and a multiplexer is shown. The prior art circuit design of FIG. 8 performs the same logic function as the prior art circuit of FIG. 5, but has a different implementation.

Figure 9:
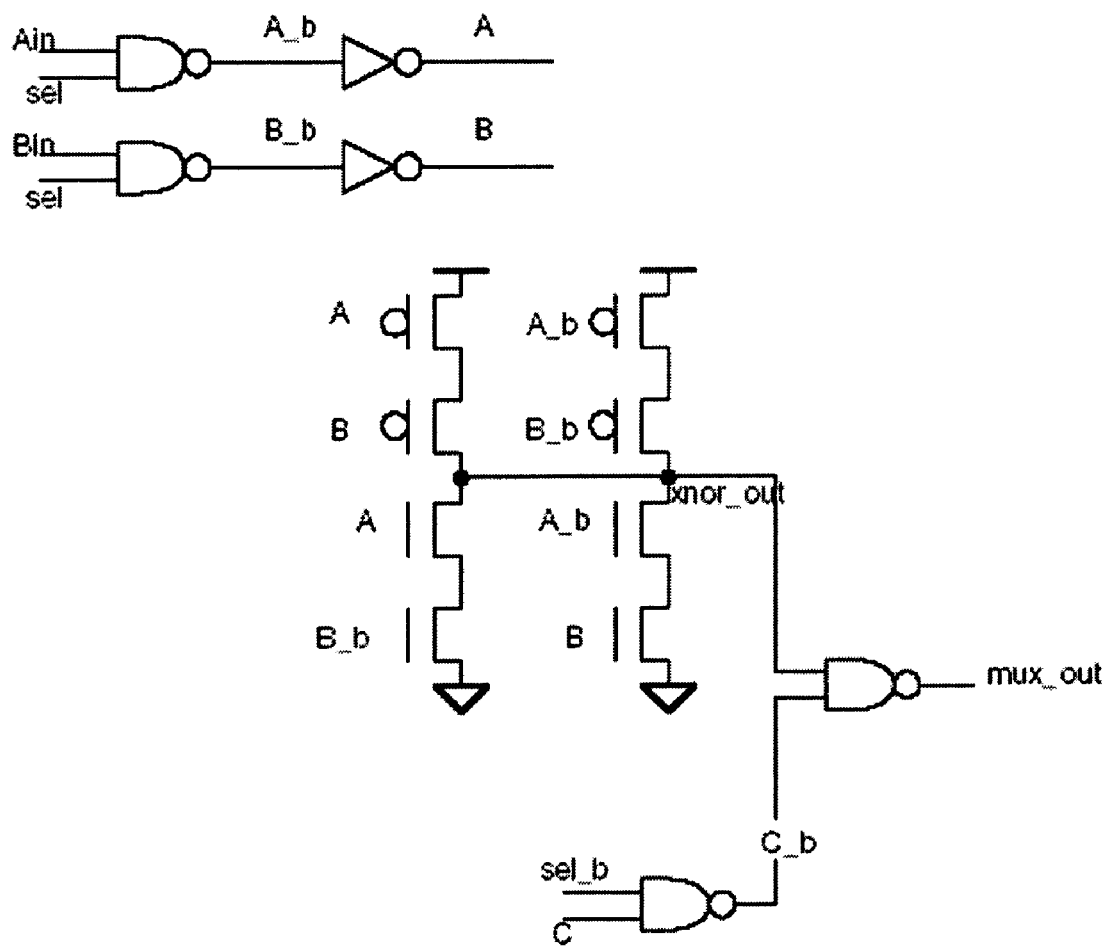
FIG. 9 is a diagram illustrating the electrical components of a modified XOR-multiplexer combinational logic circuit in accordance with an alternative embodiment of the invention.

It should be noted that the embodiment of the invention which is illustrated in FIG. 6 uses a number of circuit elements that are similar to the prior art circuit of FIG. 5. Therefore, the embodiment illustrated in FIG. 6 may be considered to be based, to some extent, upon the conventional design of FIG. 5. Likewise, the embodiment of the invention illustrated in FIG. 9 may be considered to be based, to some extent, upon the conventional design of FIG. 8.

Figure 10:
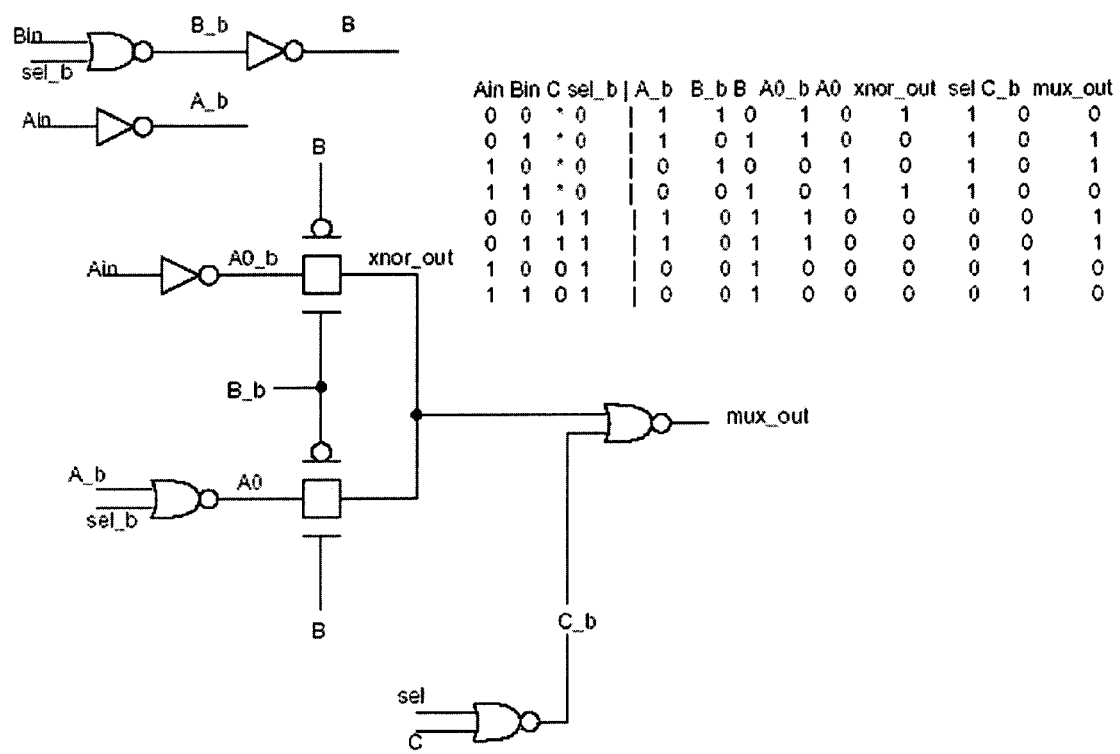
FIG. 10 is a diagram illustrating the electrical components of a modified XOR-multiplexer combinational logic circuit in accordance with another alternative embodiment of the invention.

Referring to FIG. 10, a diagram illustrating a circuit in accordance with an alternative embodiment of the invention is shown. The circuit of FIG. 10 comprises a modified XOR gate coupled to a multiplexer. FIG. 10 also includes a truth table corresponding to the circuit in the figure.

Figure 11:
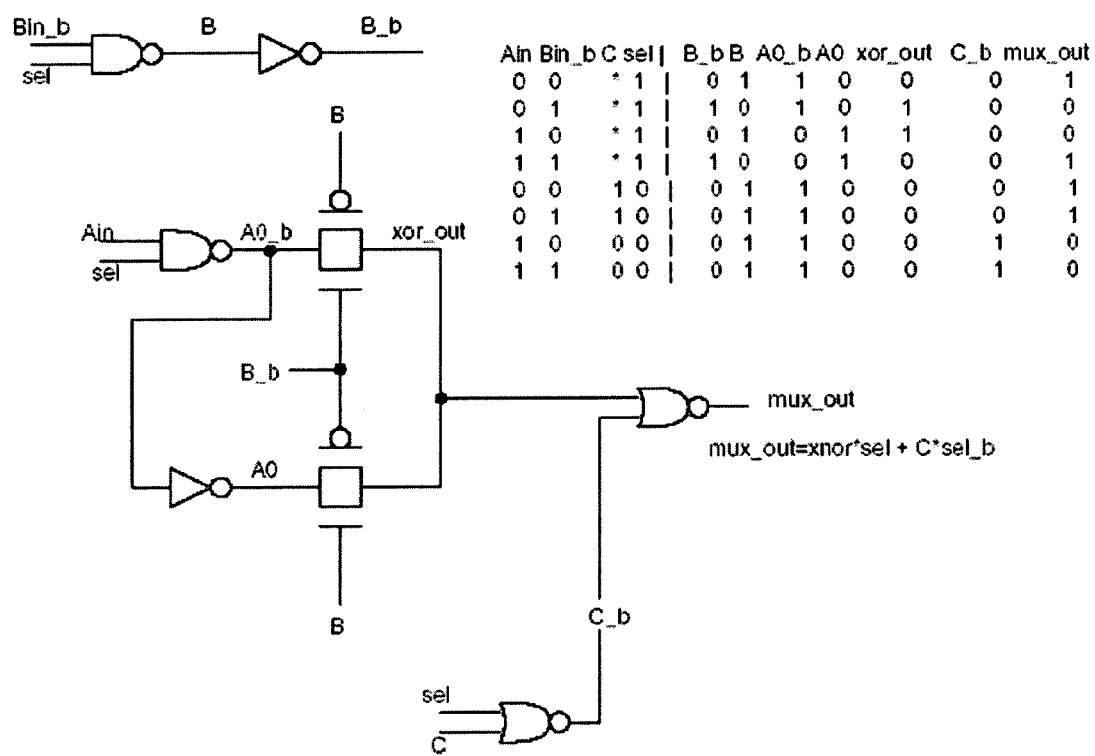
FIG. 11 is a diagram illustrating the electrical components of a modified XOR-multiplexer combinational logic circuit in accordance with yet another alternative embodiment of the invention.

Referring to FIG. 11, a diagram illustrating a circuit in accordance with another alternative embodiment of the invention is shown. The circuit of FIG. 11 comprises a modified XOR gate coupled to a multiplexer. FIG. 11 also includes a truth table corresponding to the circuit in the figure.

Figure 12:
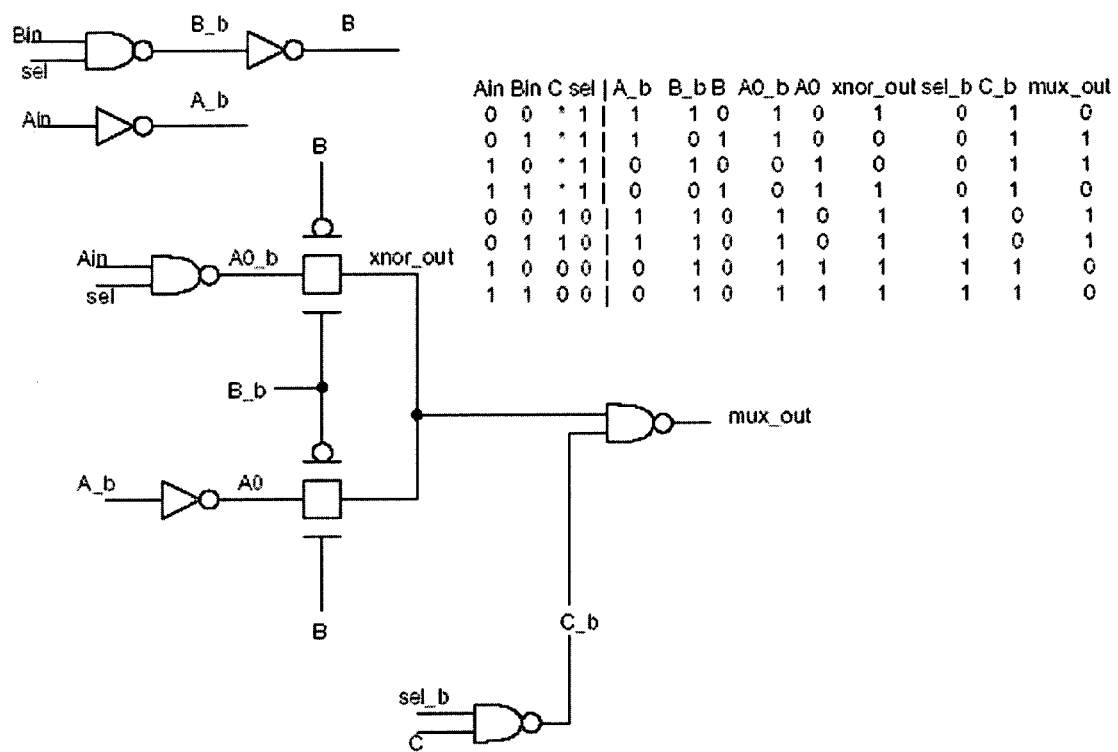
FIG. 12 is a diagram illustrating the electrical components of a modified XOR-multiplexer combinational logic circuit in accordance with yet another alternative embodiment of the invention.

Referring to FIG. 12, a diagram illustrating a circuit in accordance with yet another alternative embodiment of the invention is shown. The circuit of FIG. 12 comprises a modified XOR gate coupled to a multiplexer. FIG. 12 also includes a truth table corresponding to the circuit in the figure.

Figure 13:
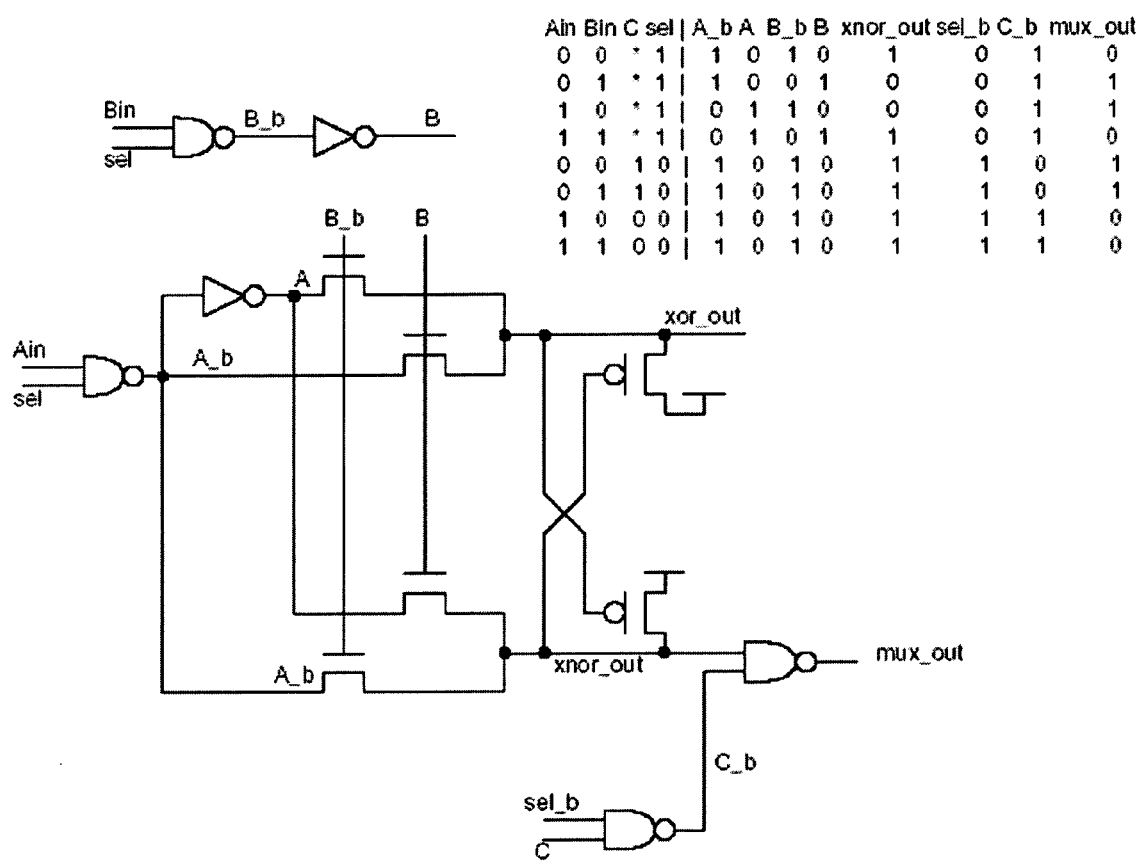
FIG. 13 is a diagram illustrating the electrical components of a modified XOR-multiplexer combinational logic circuit in accordance with yet another alternative embodiment of the invention.

Referring to FIG. 13, a diagram illustrating a circuit in accordance with still another alternative embodiment of the invention is shown. The circuit of FIG. 13 comprises a modified XOR gate coupled to a multiplexer. FIG. 13 also includes a truth table corresponding to the circuit in the figure.

Figure 14:
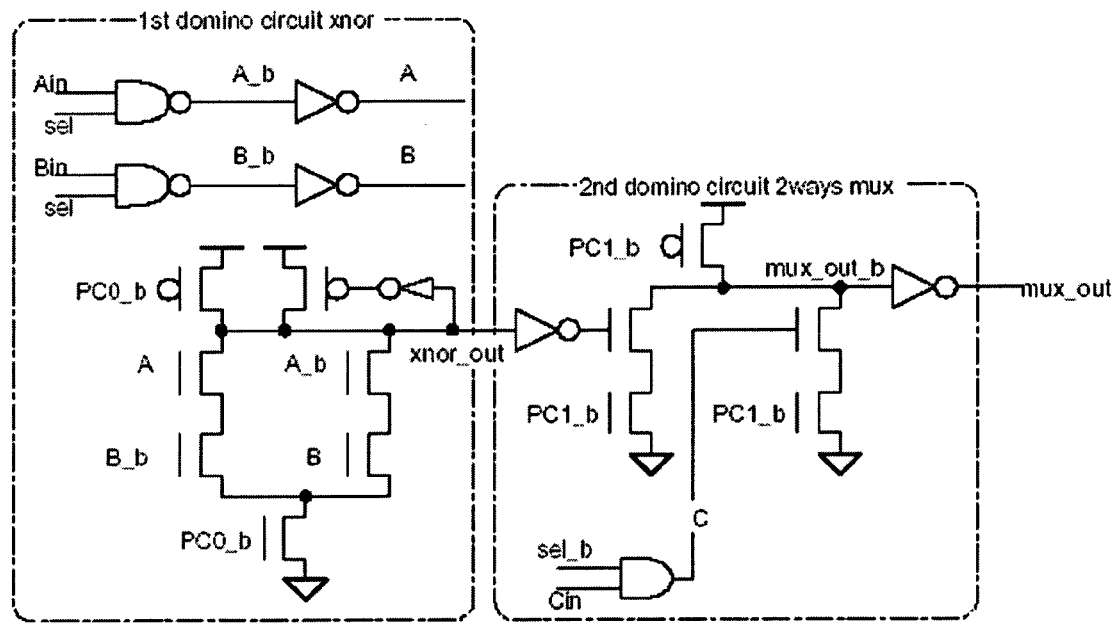
FIG. 14 is a diagram illustrating the electrical components of a modified XOR-multiplexer combinational logic circuit in accordance with yet another alternative embodiment of the invention.

Referring to FIG. 14, a diagram illustrating a circuit in accordance with yet another alternative embodiment of the invention is shown. The circuit of FIG. 14 comprises a modified XOR gate coupled to a multiplexer. FIG. 14 also includes a truth table corresponding to the circuit in the figure.

Figure 15:
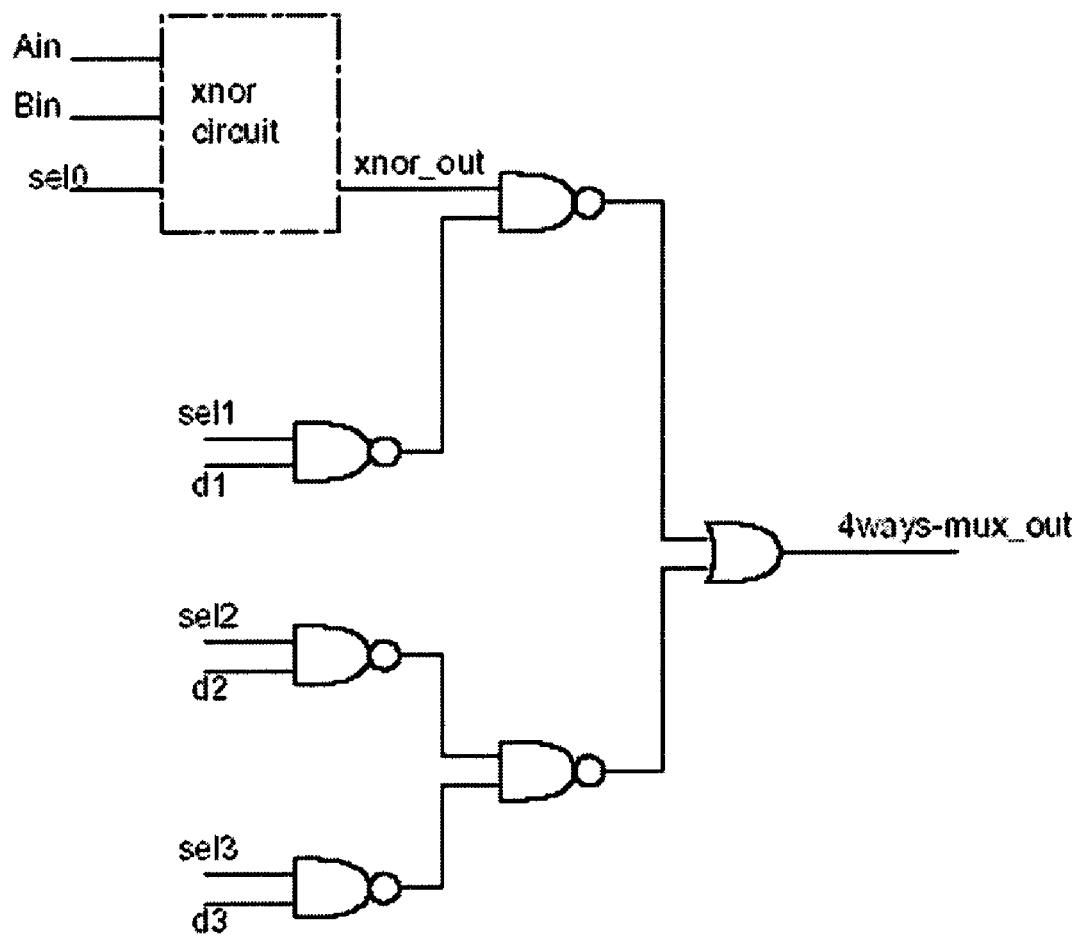
FIG. 15 is a diagram illustrating the electrical components of a modified XOR-multiplexer combinational logic circuit in accordance with yet another alternative embodiment of the invention.

Referring to FIG. 15, a diagram illustrating a circuit in accordance with another alternative embodiment of the invention is shown. The circuit of FIG. 15 comprises a modified XOR gate coupled to a multiplexer. The multiplexer in this embodiment comprises a four-way multiplexer. FIG. 15 also includes a truth table corresponding to the circuit in the figure.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

While it is anticipated that the embodiments specifically described herein will be implemented in a computer microprocessor, the various illustrative logical blocks, modules, and circuits described in connection with the embodiments disclosed herein may be implemented in a variety of ways, for example, some embodiments may eb implemented in application specific integrated circuits (ASICs), field programmable gate arrays (FPGAs), digital signal processors (DSPs) or other logic devices, discrete gates or transistor logic, discrete hardware components, or any combination thereof designed to perform the functions described herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

What is claimed is:

1. A system comprising:
   a first logic circuit configured to receive one or more logic circuit input signals and to generate a logic circuit output signal; and
   a multiplexer configured to receive the logic circuit output signal and one or more additional signals as multiplexer input signals, wherein the multiplexer is configured to receive a select signal that controls the multiplexer to select one of the multiplexer input signals to be provided as a multiplexer output signal;
   wherein when the select signal controls the multiplexer to select the logic circuit output signal as the multiplexer output signal, the first circuit operates in a first mode, and when the select signal controls the multiplexer to deselect the logic circuit output signal as the multiplexer output signal, the first circuit operates in a second mode wherein the second mode comprises a power-saving mode.

2. The system of claim 1, wherein when the first logic circuit operates in the second mode, the logic circuit output signal contains fewer data transitions than when the first logic circuit operates in the first mode.

3. The system of claim 2, wherein when the first logic circuit operates in the second mode, the logic circuit output signal contains no data transitions.

4. The system of claim 1, wherein the first logic circuit operates according to a first truth table in the first mode and according to a second truth table in the second mode, and wherein the first truth table is not identical to the second truth table.

5. The system of claim 1, wherein the first logic circuit functions as an XOR gate in the first mode.

6. The system of claim 1, wherein the first logic circuit functions as an XNOR gate in the first mode.

7. The system of claim 6, wherein the multiplexer is configured to invert the logic circuit output signal when the first logic circuit is selected.

8. The system of claim 1, wherein the multiplexer is configured to receive only 2 multiplexer input signals.

9. The system of claim 1, wherein the multiplexer is configured to receive more than 2 multiplexer input signals.

10. A method comprising:
    providing a first logic circuit configured to receive one or more logic circuit input signals and to generate a logic circuit output signal;
    providing a multiplexer configured to receive the logic circuit output signal and one or more additional signals as multiplexer input signals, wherein the multiplexer is configured to receive a select signal that controls the multiplexer to select one of the multiplexer input signals to be provided as a multiplexer output signal; and
    operating the first logic circuit in a first mode when the first logic circuit is selected by the multiplexer and operating the first logic circuit in a second mode when the first logic circuit is deselected by the multiplexer, wherein the operation of the first logic circuit is different in the first and second modes wherein the second mode comprises a power-saving mode.

11. The method of claim 10, further comprising reducing data transitions in the first logic circuit in the second mode, as compared to the first mode.

12. The method of claim 11, further comprising eliminating data transitions in the first logic circuit in the second mode.

13. The method of claim 10, operating the first logic circuit according to a first truth table in the first mode and according to a second truth table in the second mode, wherein the first truth table is not identical to the second truth table.

14. The method of claim 10, operating the first logic circuit as an XOR gate in the first mode.

15. The method of claim 10, operating the first logic circuit as an XNOR gate in the first mode.

16. The method of claim 15, inverting the logic circuit output signal when the first logic circuit is selected.

17. The method of claim 10, controlling the multiplexer to select from only 2 multiplexer input signals.

18. The method of claim 10, controlling the multiplexer to select from more than 2 multiplexer input signals.

* * * * *

UNITED STATES PATENT AND TRADEMARK OFFICE
CERTIFICATE OF CORRECTION

PATENT NO.         : 7,030,658 B2
APPLICATION NO. : 10/764179
DATED              : April 18, 2006
INVENTOR(S)        : Hiroaki Murakami, Osamu Takahashi and Jieming Qi It is certified that error appears in the above-identified patent and that said Letters Patent is hereby corrected as shown below:

On the title page replace assignee with:
(73) Assignee:   International Business Machines Corporation New York (USA)
                 Kabushiki Kaisha Toshiba Yokyo (JP)

Signed and Sealed this

Fifth Day of September, 2006

JON W. DUDAS
*Director of the United States Patent and Trademark Office*